(12) United States Patent
Frank et al.

(10) Patent No.: US 10,658,384 B2
(45) Date of Patent: May 19, 2020

(54) FERRO-ELECTRIC COMPLEMENTARY FET

(71) Applicant: INTERNATIONAL BUSINESS MACHINES CORPORATION, Armonk, NY (US)

(72) Inventors: David J. Frank, Yorktown Heights, NY (US); Paul M. Solomon, Yorktown Heights, NY (US); Xiao Sun, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/576,441

(22) Filed: Sep. 19, 2019

(65) Prior Publication Data
US 2020/0013785 A1     Jan. 9, 2020

Related U.S. Application Data

(63) Continuation of application No. 15/821,425, filed on Nov. 22, 2017.

(51) Int. Cl.
| | |
|---|---|
| *H01L 21/02* | (2006.01) |
| *H01L 27/1159* | (2017.01) |
| *H01L 29/78* | (2006.01) |
| *H01L 29/45* | (2006.01) |
| *H01L 27/092* | (2006.01) |

(52) U.S. Cl.
CPC ........ *H01L 27/1159* (2013.01); *H01L 27/092* (2013.01); *H01L 29/45* (2013.01); *H01L 29/78391* (2014.09)

(58) Field of Classification Search
CPC .......... H01L 27/1159; H01L 29/40111; H01L 27/11; H01L 29/78391; H01L 29/45; H01L 27/092; G11C 11/221; G11C 11/223

See application file for complete search history.

(56) References Cited

U.S. PATENT DOCUMENTS

| | | |
|---|---|---|
| 3,840,888 A | 10/1974 | Gaensslen et al. |
| 4,182,965 A | 1/1980 | Pfleiderer |
| 4,905,059 A | 2/1990 | Shur |

(Continued)

OTHER PUBLICATIONS

US 5,639,456 A, 11/1997, Kobayashi (withdrawn)

(Continued)

*Primary Examiner* — Ismail A Muse
(74) *Attorney, Agent, or Firm* — F. Chau & Associates, LLC

(57) ABSTRACT

A field-effect transistor includes a semiconductor substrate having first, second, third, and fourth sides, and a ferroelectric gate stack on an upper surface of the substrate. The ferroelectric gate stack includes a gate insulating layer; and a ferroelectric material layer on the gate insulating layer. Portions of the upper surface of the substrate between the first side and the ferroelectric gate stack and between the second side and the ferroelectric gate stack are doped with n-type impurities, and portions of the upper surface of the substrate between the third side and the ferroelectric gate stack and between the fourth side and the ferroelectric gate stack are doped with p-type impurities. A presence of both n and p channels in a same region increases a capacitance and voltage gain of the ferroelectric gate stack.

3 Claims, 9 Drawing Sheets

(56) References Cited

U.S. PATENT DOCUMENTS

| | | | |
|---|---|---|---|
| 5,097,311 | A | 3/1992 | Iwase et al. |
| 5,808,344 | A | 9/1998 | Ismail et al. |
| 6,201,267 | B1 | 3/2001 | Gupta et al. |
| 6,245,451 | B1 | 6/2001 | Kamisawa et al. |
| 6,420,742 | B1 | 7/2002 | Ahn et al. |
| 6,496,742 | B1 | 12/2002 | Chu |
| 6,667,506 | B1 | 12/2003 | Reedy et al. |
| 6,690,056 | B1 | 2/2004 | Reedy et al. |
| 7,432,554 | B2 | 10/2008 | Kim et al. |
| 9,159,829 | B1 | 10/2015 | Ramaswarny |
| 10,033,383 | B1 | 7/2018 | Richter et al. |
| 2001/0007447 | A1 | 7/2001 | Tanaka et al. |
| 2001/0019497 | A1 | 9/2001 | Shimada et al. |
| 2002/0068446 | A1 | 6/2002 | Wu et al. |
| 2002/0195683 | A1 | 12/2002 | Kim et al. |
| 2003/0034520 | A1 | 2/2003 | Kusunoki |
| 2005/0024811 | A1 | 2/2005 | Moriya et al. |
| 2006/0131653 | A1 | 6/2006 | Kim et al. |
| 2006/0231901 | A1 | 10/2006 | Chu |
| 2007/0272960 | A1 | 11/2007 | Hsu et al. |
| 2009/0059646 | A1 | 3/2009 | Takahashi et al. |
| 2015/0263261 | A1 | 9/2015 | Nakayama |
| 2016/0268800 | A1 | 9/2016 | Kushner et al. |
| 2018/0006130 | A1 | 1/2018 | Sakai et al. |
| 2018/0130909 | A1 | 5/2018 | Sakai et al. |
| 2019/0019800 | A1 | 1/2019 | Yoo et al. |
| 2019/0103493 | A1 | 4/2019 | Tu et al. |
| 2019/0157278 | A1 | 5/2019 | Frank et al. |
| 2019/0198617 | A1* | 6/2019 | Li ................. H01L 29/66659 |
| 2019/0312108 | A1* | 10/2019 | Li ................. H01L 29/40111 |

OTHER PUBLICATIONS

David J. Frank, et al., "The Quantum Metal Ferroelectric Field-Effect Transistor," IEEE Transactions on Electron Devices; vol. 61, No. 6, Jun. 2014, p. 2145-2153.

Sayeef Salahuddin, et al., "Use of Negative Capacitance to Provide Voltage Amplification for Low Power Nanoscale Devices," Nano Letters, 2008, vol. 8; No. 2; pp. 405-410.

\* cited by examiner

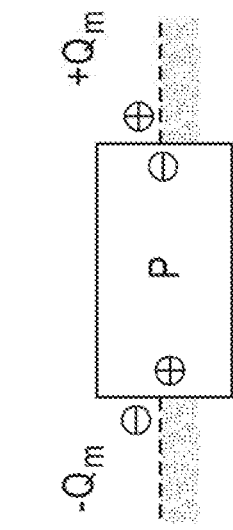
FIG. 3B
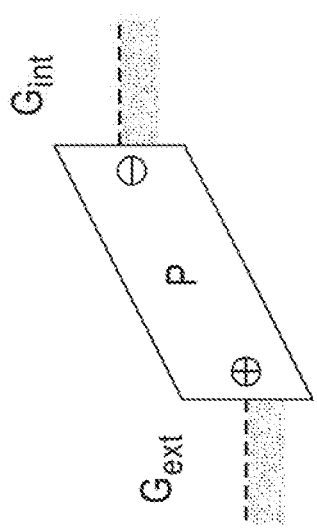
FIG. 3A
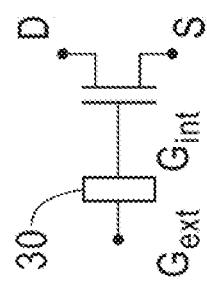
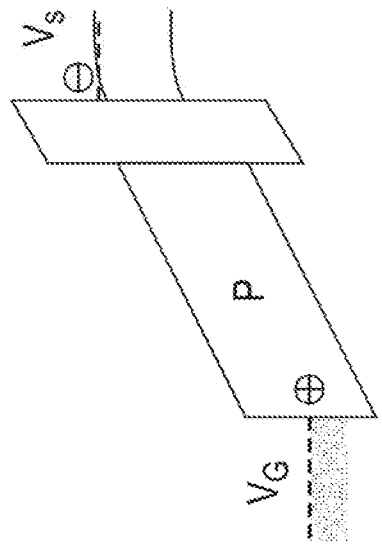
FIG. 3C
FIG. 3E
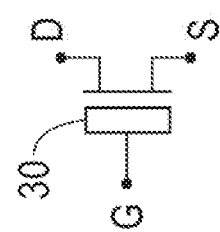
FIG. 3D

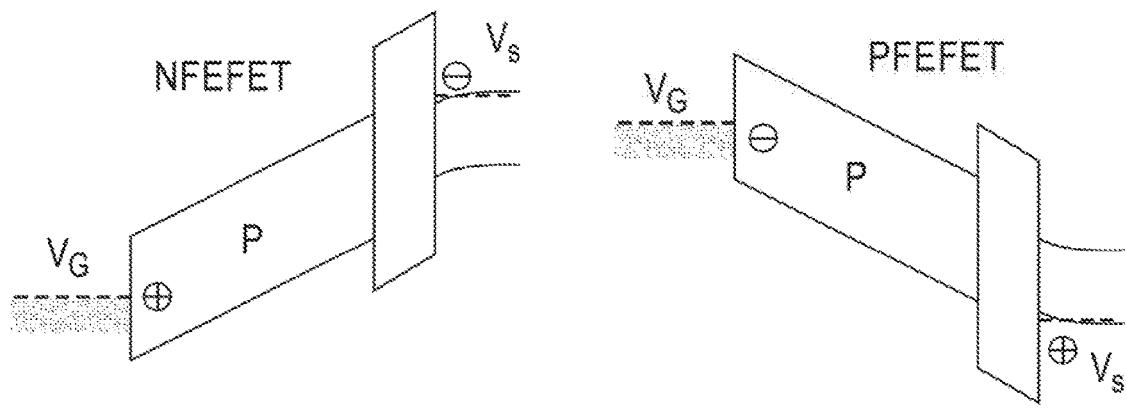
FIG. 4A     FIG. 4B
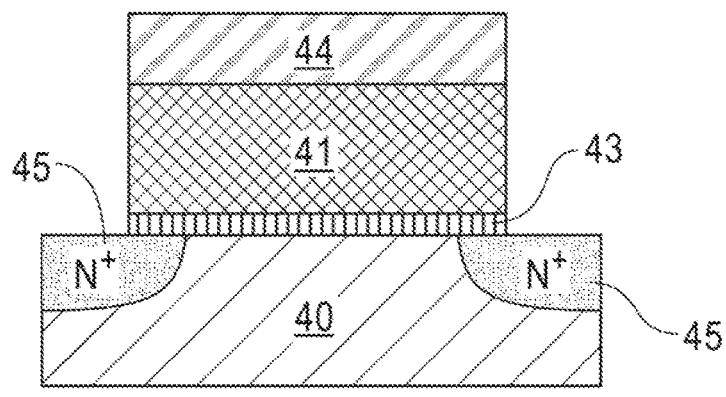 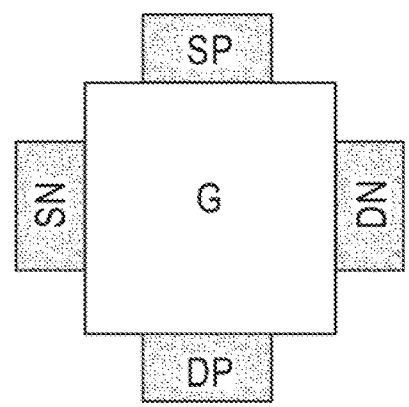
FIG. 4C     FIG. 4D

Implant and silicide blockoutmask

FERRO-ELECTRIC COMPLEMENTARY FET

CROSS REFERENCE TO RELATED U.S. APPLICATIONS

This application is a continuation of U.S. application Ser. No. 15/821,425 of Frank, et al., filed on Nov. 22, 2017 in the U.S. Patent and Trademark Office, the contents of which are herein incorporated by reference in their entirety.

TECHNICAL FIELD

Embodiments of the present disclosure are directed to solid state electronics, specifically to the structure and composition of field-effect transistors (FETs).

DISCUSSION OF THE RELATED ART

The information technology (IT) industry is facing the challenge of ever increasing power dissipation as more and more logic functions are integrated at ever increasing densities onto computer chips. One of the most effective ways of reducing power is to reduce the power-supply voltage, but that avenue is limited by the fact that complementary metal-oxide-semiconductor (CMOS) devices have, at best, a 60 mV/decade requirement on voltage swing leading to typical power-supply voltages >0.8 V. Recently it has been proposed that using a ferroelectric (FE) capacitor as a negative capacitance element, which would increase the slope of the turn-on characteristic. This is illustrated in FIGS. 1A-C.

FIG. 1A illustrates a ferroelectric capacitor 10 with polarization P and bounded by two metal plates on the surfaces normal to the polarization direction and a series (load) capacitor 11 $C_{LOAD}$. P is the polarization of the ferroelectric. The units of P are dipole-moment per unit volume or charge per unit area. Q is charge per unit area. A ferroelectric material with polarization P will have a charge Q on the plates satisfying $Q=\varepsilon_0 E+P$, where E is the electric field, i.e., the voltage between the plates divided by their separation, and $\varepsilon_0$ is the permittivity of free space. In FIG. 1A, according to embodiments, the first part is neglected and it is assumed that Q=P. The voltage across $C_{LOAD}$ is Vc. The total, applied voltage across the ferroecectric capacitor and $C_{LOAD}$ (in series) is $V_{appl}$. The charge on the capacitor plates is the same as on the ferroelectric electrodes but it also satisfies the equation $Q=C_{LOAD} V_{appl}$. The solution of the ferroelectric and capacitor equations as a function of voltage is shown graphically in FIG. 1B. FIG. 1B illustrates the FE characteristic 12 that shows the matching of the negative slope region to the capacitor load-line 13, and FIG. 1C illustrates a comparison of composite characteristics 14 with the characteristics of a capacitor alone 15 as a function of voltage, where a load capacitor, having the same charge vs. voltage slope as the negative polarization vs. voltage characteristic of the FE capacitor, produces a much steeper charge vs. voltage curve than the original capacitor, thus reducing the voltage needed to obtain a given change in the charge.

SUMMARY

Exemplary embodiments of the present disclosure are directed to a p and n channel FET integrated into a compact structure sharing a common ferroelectric gate and a common channel area. The ferroelectric gate provides the voltage amplification needed to make the combination work as well as permitting the device to operate at lower voltages than a conventional CMOS, thereby saving power.

According to an embodiment of the disclosure, there is provided a field-effect transistor (FET), including a semiconductor substrate having a first side, a second side opposite from the first side, a third side that connects the first side and the second side, and a fourth side opposite the third side that connects the first side and the second side; and a ferroelectric gate stack disposed on a central portion of an upper surface of the substrate. The ferroelectric gate stack includes a gate insulating layer; and a ferroelectric material layer disposed on the gate insulating layer. A portion of the upper surface of the substrate that extends from the first side to under the ferroelectric gate stack and a portion of the upper surface of the substrate that extends from the second side to under the ferroelectric gate stack is doped with n-type impurities forming n-type contacts along the first side and the second side, and a portion of the upper surface of the substrate that extends from the third side to under the ferroelectric gate stack and a portion of the upper surface of the substrate that extends from the fourth side to under the ferroelectric gate stack is doped with p-type impurities forming p-type contacts along the third side and the fourth side. A presence of both n and p channels in a same region increases a capacitance and voltage gain of the ferroelectric gate stack.

According to a further embodiment of the disclosure, the FET includes a metal layer disposed on the ferroelectric material layer.

According to a further embodiment of the disclosure, the FET includes self-aligned silicided contacts formed in the n-types contacts and in the p-type contacts; sidewall spacers form along sides of a stack of the gate insulating layer, the ferroelectric material layer, and the metal layer, and self-aligned silicided shorts between at least one n-type contact and at least one p-type contact.

According to a further embodiment of the disclosure, the FET has a 1:1 width to length (W/L) ratio.

According to a further embodiment of the disclosure, an invertor further includes the FET and a self-aligned silicided short between a first n-type contact along the first side and a first p-type contact along the third side. A second n-type contact along the second side is connected to ground, a second p-type contact along the fourth side is connected to a supply voltage, and the self-aligned silicided short is connected to an output terminal.

According to a further embodiment of the disclosure, a 2-NAND gate first and second FETs, a self-aligned silicided short between a first n-type contact along the first side of the second FET and a first p-type contact along the third side of the second FET, a second n-type contact along the second side of the first FET connected to ground, a second p-type contact along the fourth side of the first FET and a second p-type contact along the fourth side of the second FETR that are connected to a supply voltage, a second n-type contact along the second side of the second FET connected to a first n-type contact along the first side of the first FET, and a first p-type contact along the third side of the first FET and the self-aligned silicided short that are connected to an output terminal.

According to a further embodiment of the disclosure, a parasitic p-field-effect transistor includes the FET, a first n-type contact along the first side connected to an input terminal, a first p-type contact along the third side connected to a supply voltage, a second n-type contact along the second side connected to an output terminal, and a second p-type contact along the fourth side that is unconnected.

According to a further embodiment of the disclosure, an SRAM circuit includes first, second, third and fourth parasitic FETs; a first via that connects an output of a first FET to an input of a second FET; a third via that connects an output of the second FET to an input of a third FET; a second via that connects an output of the third FET to an input of the fourth p-FET; a fourth via that connects an output of the second FET to an inlut of the fourth FET. An input of the first FET is connected to a left bit line, an output of the fourth FET is connected to a right bit line, the ferroelectric gate stacks of the first and fourth FETs are connected to word lines, and second p-type contacts of the second and third FETS are connected to ground.

According to another embodiment of the disclosure, there is provided a field-effect transistor (FET), including a semiconductor substrate having a first side, a second side opposite from the first side, a third side adjacent to the first side, and a fourth side adjacent to the second side and opposite the third side; and a ferroelectric gate stack disposed on a central portion of an upper surface of the substrate. The ferroelectric gate stack includes a gate insulating layer; and a ferroelectric material layer disposed on the gate insulating layer. A portion of the upper surface of the substrate that extends from the first side to under the ferroelectric gate stack and a portion of the upper surface of the substrate that extends from the first side to under the ferroelectric gate stack is doped with n-type impurities forming n-type contacts along the first side and the second side, and a portion of the upper surface of the substrate that extends from the third side to under the ferroelectric gate stack and a portion of the upper surface of the substrate that extends from the fourth side to under the ferroelectric gate stack is doped with p-type impurities forming p-type contacts along the third side and the fourth side. A presence of both n and p channels in a same region increases a capacitance and voltage gain of the ferroelectric gate stack.

According to a further embodiment of the disclosure, the FET includes a metal layer disposed on the ferroelectric material layer.

According to a further embodiment of the disclosure, the FET includes a silicide block out mask that separates the p-type contact on the third side from the n-type contact on the first side.

According to a further embodiment of the disclosure, the FET includes a silicide block out mask that separates the p-type contact on the fourth side from the n-type contact on the second side.

BRIEF DESCRIPTION OF THE DRAWINGS

FIG. 3A shows an n-FET and a separate FE capacitor, according to embodiments of the disclosure.

FIG. 3B is a band diagram for the FE capacitor in FIG. 3A under applied bias, according to embodiments of the disclosure.

FIG. 3C is the band diagram after voltage has relaxed to zero, according to embodiments of the disclosure.

FIG. 3D shows an n-FET and an integral FE capacitor, according to embodiments of the disclosure.

FIG. 3E is a band diagram for a structure of FIG. 3D under applied bias, according to embodiments of the disclosure.

FIG. 4A is a band diagram of an FE being applied to an n-FET, according to embodiments of the disclosure.

FIG. 4B is a band diagram of an FE being applied to a p-FET, according to embodiments of the disclosure.

FIG. 4C shows a cross section of a structure for the n-FET of FIG. 4A, according to embodiments of the disclosure.

FIG. 4D is a plan view showing the orthogonal placement of N and P contacts about a gate, according to embodiments of the disclosure.

DETAILED DESCRIPTION OF EXEMPLARY EMBODIMENTS

Figure 1A:
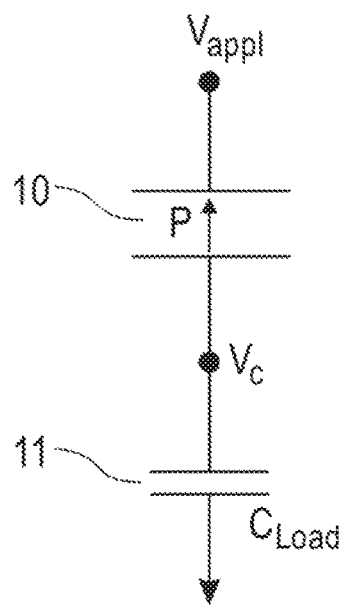
FIG. 1A illustrates a ferroelectric capacitor with a capacitor load $C_{LOAD}$, according to embodiments of the disclosure.
Figure 1B:
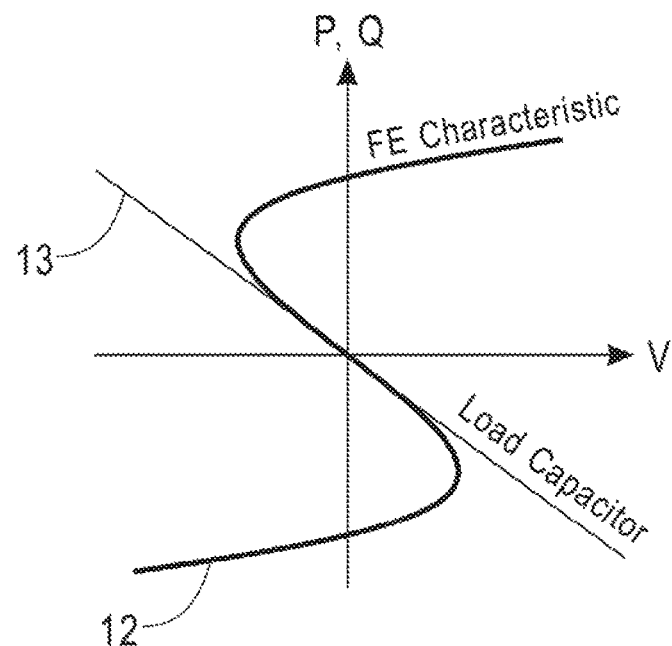
FIG. 1B illustrates an FE characteristic that shows the matching of the negative slope region to the capacitor load-line, according to embodiments of the disclosure.
Figure 1C:
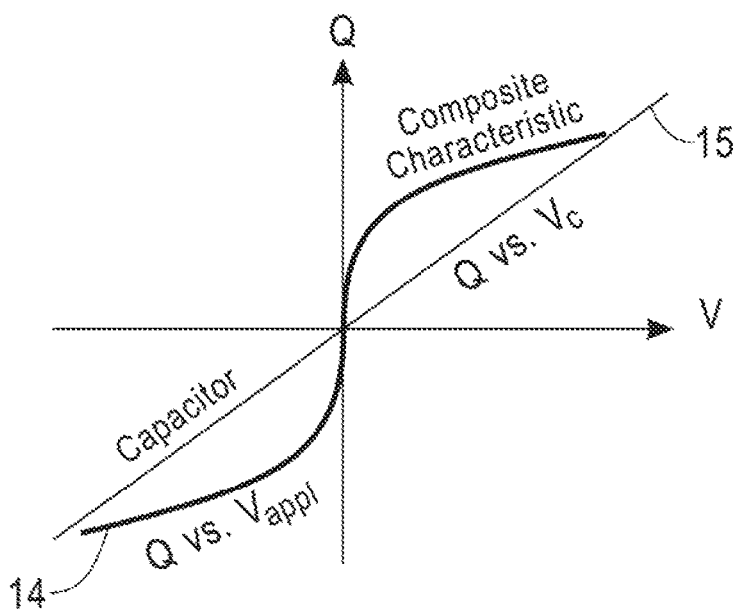
FIG. 1C illustrates a comparison of composite characteristics with the characteristics of a capacitor alone, according to embodiments of the disclosure.

Exemplary embodiments of the disclosure as described herein generally provide systems and methods for integrating a p and n channel FET into a compact structure sharing a common ferroelectric gate and a common channel area. While embodiments are susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

Figure 2A:
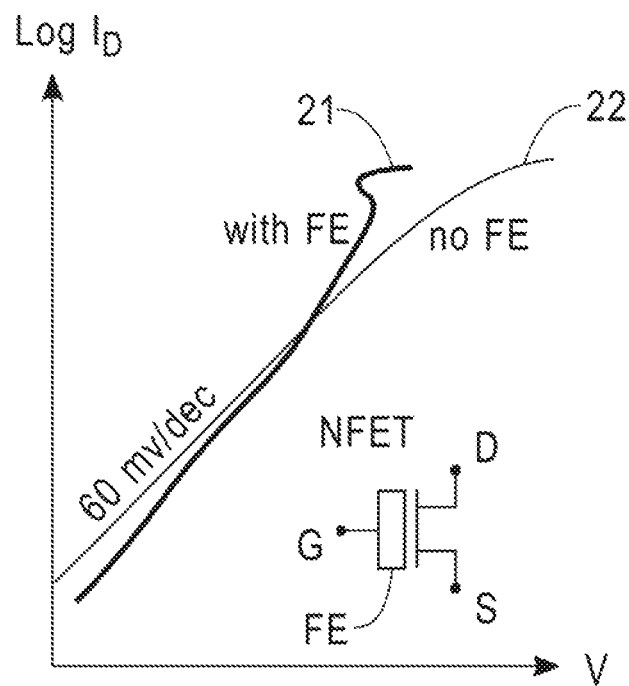
FIG. 2A illustrates the improvement of characteristics of a ferroelectric capacitor FE integrated into a gate of an FET as compared to a capacitor with no ferroelectric material, according to embodiments of the disclosure.
Figure 2B:
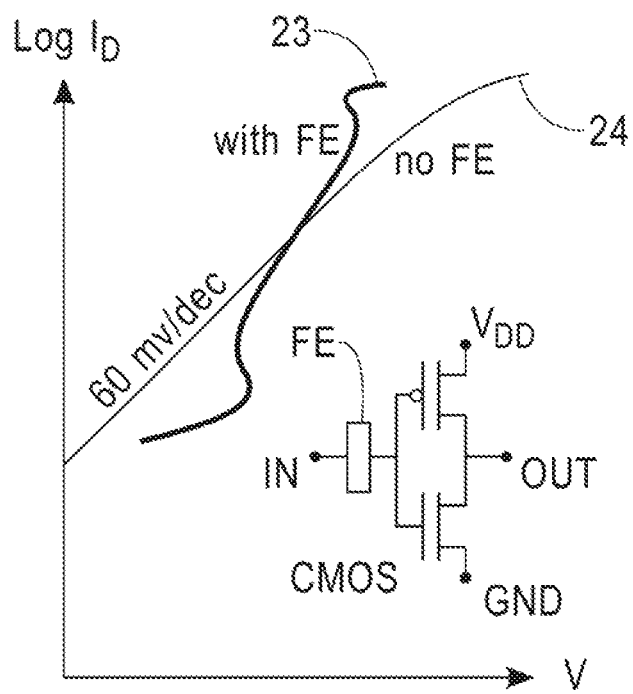
FIG. 2B illustrates the improvement of characteristics of a ferroelectric capacitor FE as applied to an input of a CMOS inverter as compared to a capacitor with no ferroelectric material, according to embodiments of the disclosure.

According to embodiments of the disclosure, a ferroelectric (FE) capacitor can be a negative capacitance element in an FET, as shown in FIG. 2A, with gate G, source S and drain D, by depositing a ferroelectric material onto the gate. FIGS. 2A and 2B also graph the drain current ID of the n-FET in the figure as a function of voltage. Only n-FET characteristics are illustrated in the graphs. One can assume that a p-FET will be improved in the same way since the p-FET is complementary to the n-FET, the characteristics being reversed along the voltage axis. It is the extra p-FET capacitance that causes the n-FET slope to be steeper at low currents. For the pFET, the nFET capacitance plays a similar role. FIG. 2A illustrates the improvement of characteristics 21 of a ferroelectric capacitor FE integrated into a gate of an FET as compared to a capacitor with no ferroelectric material 22. However, a challenge is that the capacitance of the FET is very non-uniform, being large only above a threshold, so that matching it to the FE capacitor over a whole range of gate voltage is not possible. In the case of FIG. 2A, matching occurs at the high end of the gate voltage range, increasing the slope in this region.

According to an embodiment of the disclosure, a single FE capacitor can be applied to the gate of both the n-FET and the p-FET of a CMOS inverter, as shown in FIG. 2B, which illustrates the improvement of characteristics 23 of a ferroelectric capacitor FE as applied to an input of a CMOS inverter with input IN, output OUT, ground GND, and $V_{dd}$ is the supply voltage across the CMOS inverter, as compared to a capacitor with no ferroelectric material 24. In this configuration according to an embodiment, the inverter input capacitance is high both for high, n-FET on, and for low, p-FET on, gate voltages. This enables voltage amplification by the FE over a much larger gate voltage range, as shown in the figure, so that the n-FET characteristic is steepened at both high and low gate voltages.

According to an embodiment for the n-FET implementation, the FE capacitor is integral with the gate, i.e., the channel sees the FE field directly, whereas in the CMOS implementation, a discrete FE capacitor is used and the FET channel is influenced indirectly, through the voltage. This situation is discussed next.

Drift and Leakage with Integral Capacitor

According to an embodiment, the issue with using a discrete FE capacitor is illustrated in FIG. 3A-E. FIG. 3A shows an n-FET and a separate FE capacitor 30, with external gate voltage $V_{Gext}$ and internal gate voltage $V_{Gint}$, FIG. 3B is a band diagram for the FE capacitor in FIG. 3A under an applied bias, FIG. 3C is a band diagram after voltage has relaxed to zero, where $+/-Q_m$ are the charges on the metal electrodes, which cancel the polarization charges, FIG. 3D shows an n-FET and an integral FE capacitor, and FIG. 3E is a band diagram for the structure of FIG. 3D under applied bias, where $V_G$ is a gate voltage, and $V_S$ is a source voltage. For the discrete capacitor, 30, the charges $+/-Q_m$ are introduced causing the voltage across the capacitor to decay with time. Even though the FE polarization P may be remembered, the voltage across the FE capacitor eventually decays to zero if the capacitor is left undisturbed for any length of time, typically milliseconds, due to leakage currents. This could occur if the CMOS gate is held in a particular state, high or low, and the leakage through the gate insulator is much less than that of the FE capacitor. Thus any expected voltage amplification needed to increase the turn-on slope also disappears. In fact, any asymmetry in the high vs. low duty factor would cause undesirable drift of the FE capacitor voltage operating point.

Adding leakage to the gate insulator would not resolve the issue; it would actually degrade the gain of the FET. This is because, under DC conditions, the applied voltage would now be divided between the FE and gate input capacitors with less and less applied to the gate as the leakage increases.

On the other hand, according to an embodiment, as shown in FIGS. 3D and 3E, when the FE is integral with the gate, there is nowhere for the compensating charge to reside, so that the FE field does not decay with time as long as the polarization is preserved. This argument assumes that the interface state density between the FE and the gate insulator is small.

Applying the FE to the n- and p-FETs individually will just reproduce the situation in FIG. 2A whereas the situation of FIG. 2B is desired. According to embodiments, there exists a structure where a single FE can be applied to both p- and n-FETs without the need for an intermediate electrode.

p and n-FETs Sharing a Common Gate and Channel but Separate Channel Contacts

According to embodiments, FIG. 4A is a band diagram of an FE being applied to an n-FET, while FIG. 4B is a band diagram of an FE being applied to a p-FET. Notice that the only difference between the two is the polarity of the gate voltage and the type of charge carrier, e.g., electrons or holes, in the semiconductor. FIG. 4C shows a cross section of a structure for the n-FET of FIG. 4A, with gate insulator 43 on semiconductor 40, the FE layer 41 on the gate insulator 43, and a metal later 44 on the FE layer 41. The N+ doping 45 only needs to be applied to the contacts since the electrons can flow from the contacts into the channel as in any FET.

According to embodiments, the situation is identical for the p-FET except the contacts are now p-type and holes rather than electrons are induced. By placing n-type contacts along the edges of the gate stack in one direction, and p-type contacts in the orthogonal direction both an n-FET and an p-FET can be integrated into the same device, referred to herein below as a FECFET. FIG. 4D is a plan view showing the orthogonal placement of N and P contacts, SN, DN, SP, DP, respectively, about the gate G. The two devices do not interfere with each other because the one is activated at positive and the other at negative gate voltages.

Figure 5A:
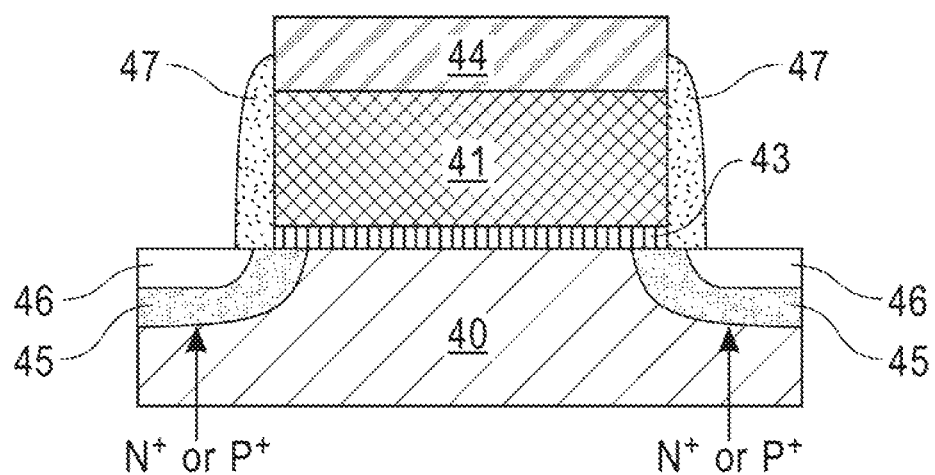
FIG. 5A shows an n-type cross-section, according to embodiments of the disclosure.
Figure 5B:
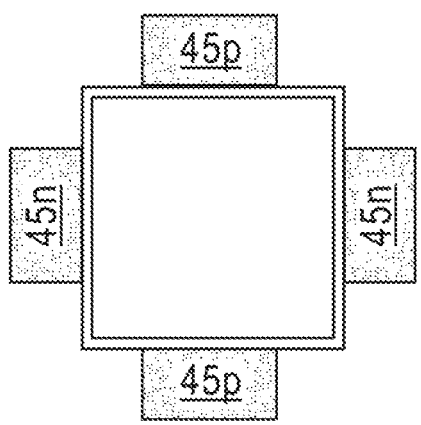
FIG. 5B is plan-view with N+ and P+ contacts, according to embodiments of the disclosure.
Figure 5C:
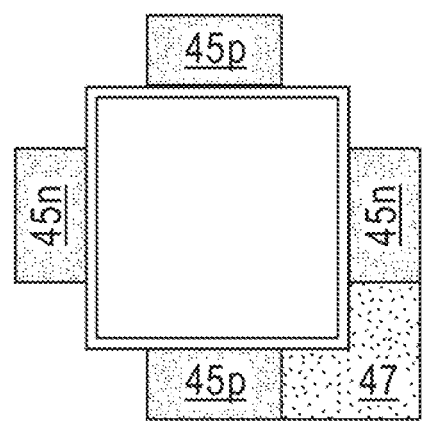
FIG. 5C is a plan view of a self-aligned silicided short between n- and p-type contacts, according to embodiments of the disclosure.

According to embodiments, further details of FECFETs with self-aligned silicided contacts and gate sidewall spacer are shown in FIGS. 5A-C, where the contacts are silicided as in conventional CMOS devices, using silicide 46 self-aligned to an insulating spacer 47. FIG. 5A shows an n-type cross-section, FIG. 5B is plan-view with N+ contacts 45n and P+ contacts 45p, and FIG. 5C is a plan view of a self-aligned silicided short 47 between n- and p-type contacts 45n and 45p. This silicide can also be used as a self-aligned connection between the N and P type contacts to facilitate very compact layouts.

Logic Gate Implementation Using FECFET

Figure 6A:
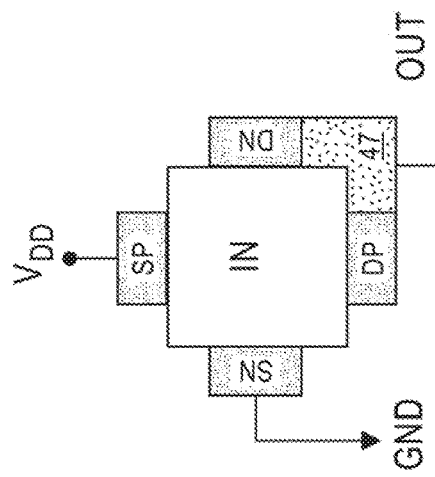
FIG. 6A shows a generic CMOS inverter circuit, according to embodiments of the disclosure.
Figure 6B:
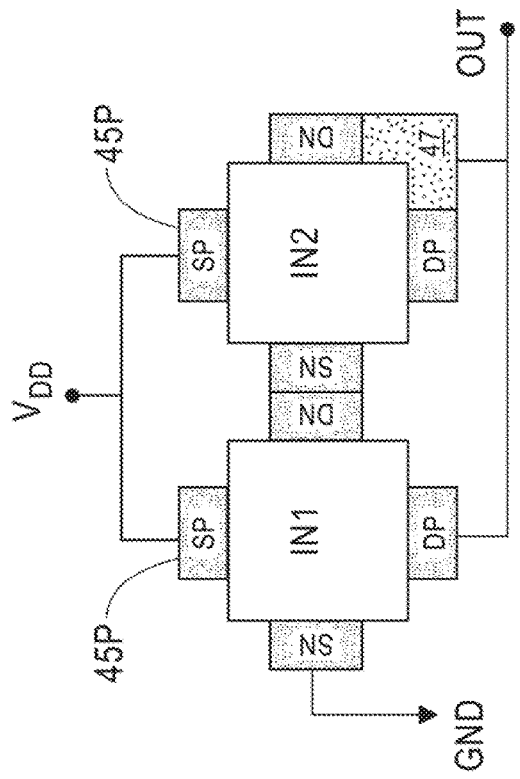
FIG. 6B shows a CMOS inverter implementation using a single FECFET, according to embodiments of the disclosure.
Figure 6C:
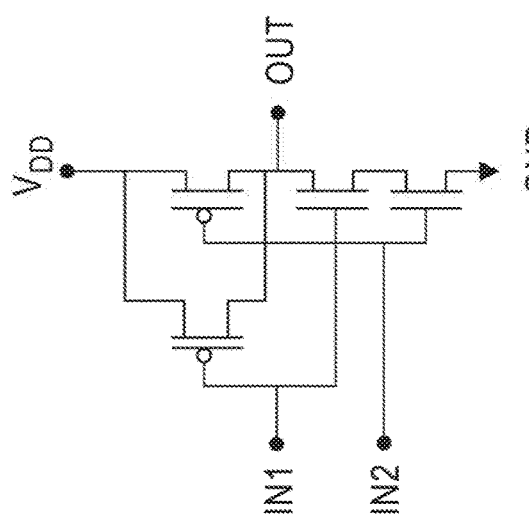
FIG. 6C shows a generic circuit of a 2-NAND gate, according to embodiments of the disclosure.
Figure 6D:
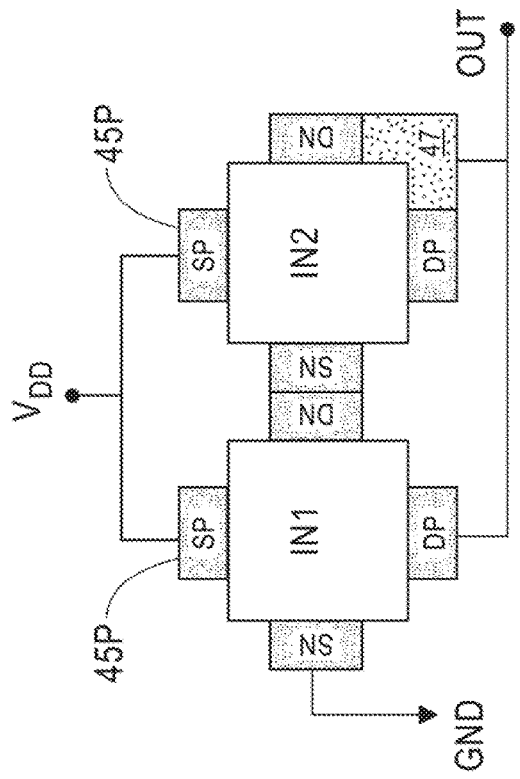
FIG. 6D shows a 2-NAND gate implementation using two FECFETs, according to embodiments of the disclosure.

According to embodiments, FIG. 6A shows a generic CMOS inverter circuit with input IN, output OUT, ground GND, and supply voltage $V_{dd}$, FIG. 6B shows an implementation using a single FECFET with gate G connected to the input IN, one N+ contact SN connected to ground GND, the self-aligned silicided short 47 connected to OUT, and $V_{DD}$ connected to one P+ contact SP, FIG. 6C shows a generic circuit of a 2-NAND gate, with two inputs IN1 and IN2, output OUT, ground GND, and supply voltage $V_{dd}$, and FIG. 6D shows an implementation using two FECFETs. In this implementation, the VDD is connected to both SP contacts 45p of input IN1 and 1N2, contact SN 45n is connected to gound GND, contact DN of the first input IN1 is connected to contact SN of the second input IN2, and the output is connected to contact DP of the first input IN1 and the self-aligned silicided short 47 of the second input IN2. An inverter as shown in FIG. 6A can be made from a single FECFET as shown in FIG. 6B. A design according to embodiment uses a self-aligned silicide bridge for greater compactness of layout to connect the N-FEFET and P-FEFET drains at the output. The 2-NAND depicted in FIGS. 6C and 6D is even more compact, compared to a standard layout, since cross-overs have been eliminated.

Figure 7A:
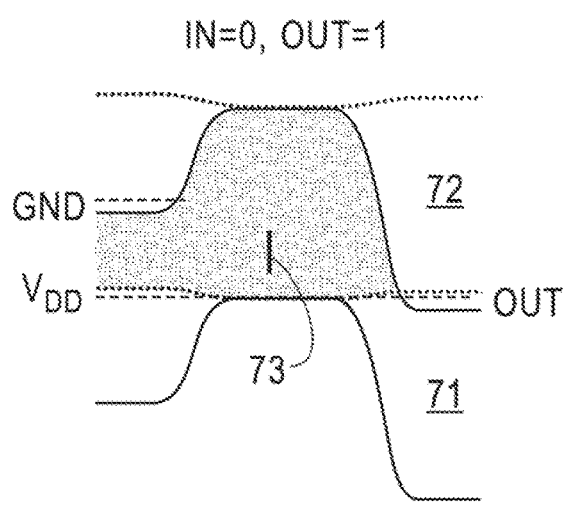
FIG. 7A depicts a band diagram of an FECFET inverter, showing the quiescent input low and output high state, according to embodiments of the disclosure.
Figure 7B:
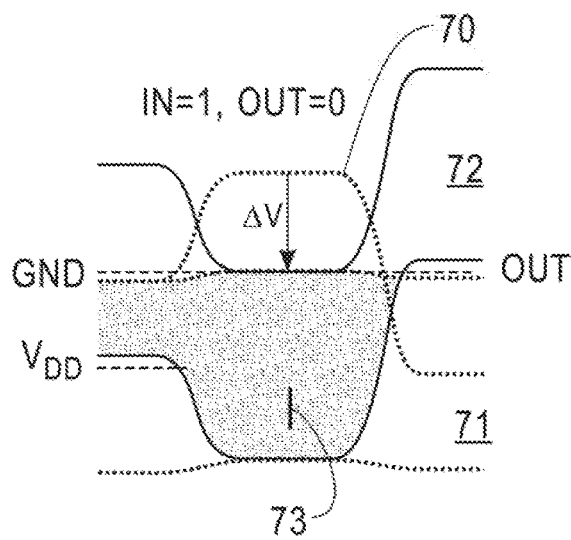
FIG. 7B shows the quiescent input low and output high state, according to embodiments of the disclosure.
Figure 7C:
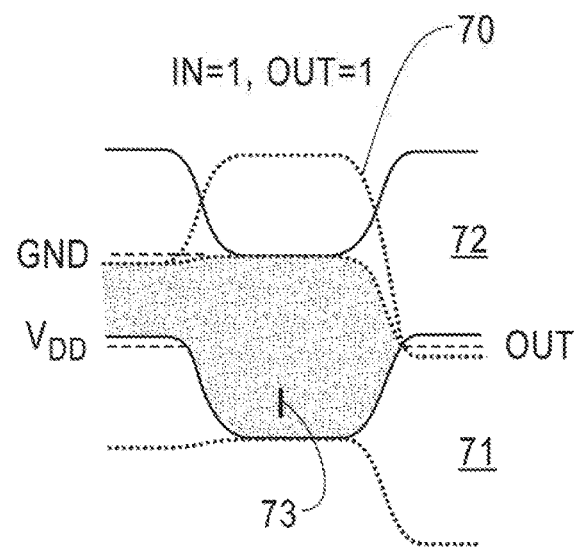
FIG. 7C shows the transient state where both input and outputs are high, according to embodiments of the disclosure.

According to embodiments, band diagrams of this device are considered under different modes of operation to verify that it can work and to put some limits on the internal gate and power supply voltages, as illustrated in FIGS. 7A-C, each of which shows ground GND, the supply voltage $V_{DD}$, and the output level OUT. FIG. 7A depicts band diagrams of an FECFET inverter in the quiescent input low and output high state, FIG. 7B shows the quiescent input high and output low state, and FIG. 7C shows a transient state where both input and outputs are high. Typically this would occur after the input is rapidly switched from low to high and the output does not have time to respond. The regions 71 are bands for the n-FET along the SN-DN axis of FIG. 6B, and the regions 72 are the bands for the p-FET, along the SP-DP axis of FIG. 6B. The dotted curve 70 used for a reference in FIGS. 7B and 7C is the N-FET conduction band edge corresponding to FIG. 7A. Outside of the gate area the n- and p bands are generally separated due to different terminal voltages applied to the p and n-FET and due to differing band alignments for p and n-type contacts. The bands overlap 73 at the center of the gate area.

According to an embodiment, FIG. 7A shows the inverter in the output high state with the N-FET off and the P-FET on. The power supply voltage, $V_{DD}$, must be less than the semiconductor bandgap for there to be a barrier for injection from the source of the N-FET into the channel, i.e., to suppress the off-current of the n-FET. FIG. 7B shows the opposite state with the N-FET on and the P-FET off. FIG. 7C shows a transient situation where both input and output are high. In this case the n-FET will conduct current to pull down the output voltage. It can be seen that in all of the above cases an inverter according to an embodiment performs normally.

According to an embodiment, an internal potential difference, A, is used to change states. By inspection of the band diagrams, it can be seen that $V_{DD}+\Delta\psi=E_G/e$, where $E_G$ is the bandgap and e the charge on an electron. The change of internal gate voltage, $\Delta V_{Gi}$, after amplification by the FE is greater than $\Delta\psi$ to allow for overdrive, i.e., the voltage across the gate insulator needed to induce the channel charge. As an example, a silicon-germanium alloy with a bandgap of 0.9 eV and with $V_{DD}$ of 0.3V gives a $\Delta_\psi$ of 0.6V. With an overdrive of 0.1 V, this would require $\Delta V_{Gi}=0.7V$, an amplification factor of 7/3 would be needed to ensure that an output voltage change of $V_{DD}$ is large enough to switch a succeeding stage. This amplification requirement could be reduced if a larger $V_{DD}$, but less than 0.9V, were chosen, but this would increase power dissipation.

Static RAM

Figure 8A:
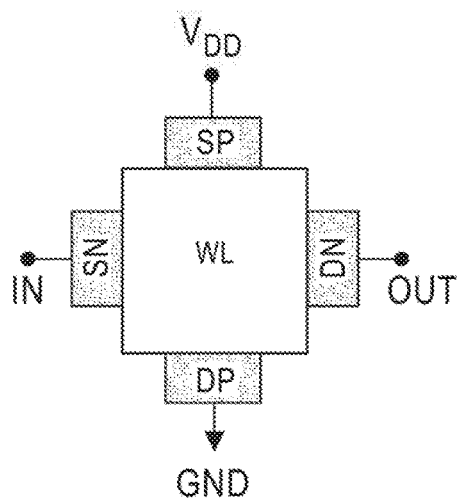
FIG. 8A is a layout diagram of an access device for an SRAM, according to embodiments of the disclosure.
Figure 8B:
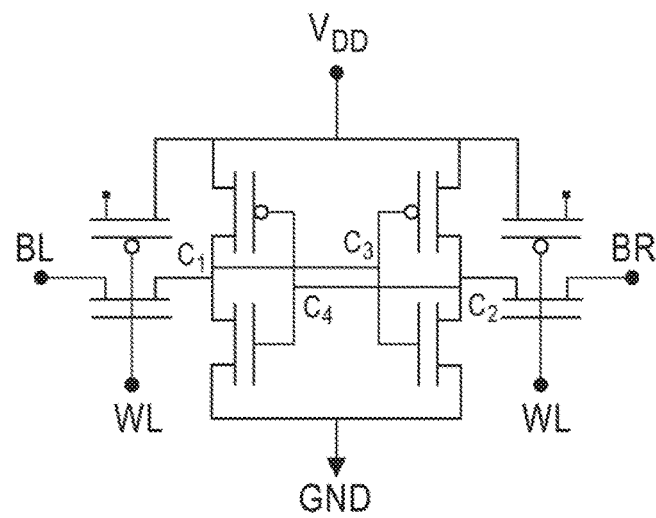
FIG. 8B depicts an SRAM 4-FECFET circuit, according to embodiments of the disclosure.
Figure 8C:
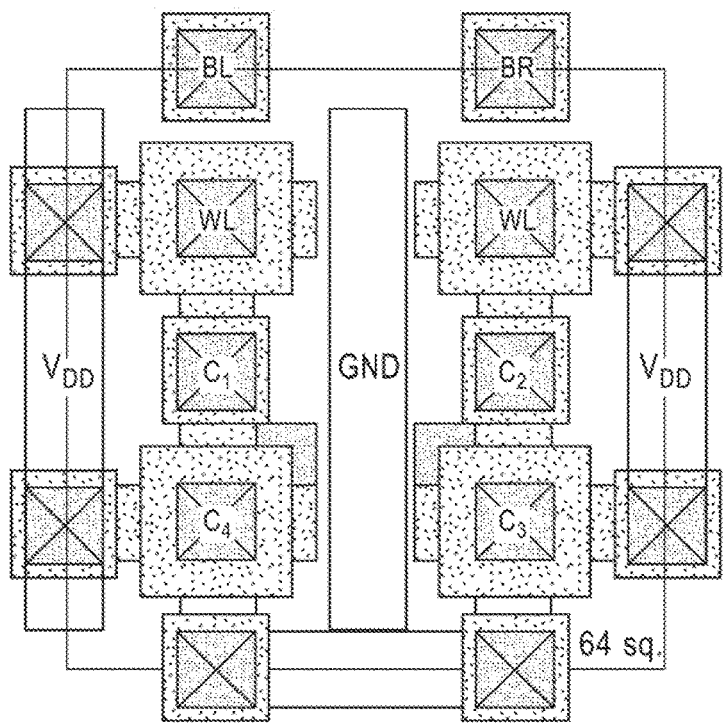
FIG. 8C is a layout diagram of a 4-FECFET SRAM of FIG. 8B implemented in 64 lithographic squares, according to embodiments of the disclosure.

FIGS. 8A-C show a compact SRAM cell implemented using FECFETs. The internal cell in implemented using two cross-coupled FECFET inverters while the access devices use the NFETs only, thus include parasitic PFETs. FIG. 8A is a layout diagram of an access device for an SRAM that shows connections of a parasitic p-FET, with input connected to N+ contact SN, output OUT connected to N+ contact DN, $V_{DD}$ connected to P+ contact SP, and P+ contact DP is left floating. Thus, for the access transistors only, the n-FETs are used and the p-FETs are biased as not to interfere. DP can also be connected to VDD, but this would increase the SRAM cell area. FIG. 8B depicts an SRAM 4-FECFET circuit and shows connection of access devices, with left bit line BL connected to an input of the leftmost FET, right bit line BR connected to output of the rightmost FET, word line WL connected to the gates of the left and right FETs, vias c1, c3 that connect left inverter output to right inverter input, vias c2, c4 that connect right inverter output to left inverter input, and contact DP of the two inner FETs connected to ground GND. FIG. 8C is a layout diagram of a 4-FECFET SRAM of FIG. 8B implemented in 64 lithographic squares that include internal silicide connections. The upper wiring levels are used to connect $C_1$ to $C_3$ and $C_2$ to $C_4$. According to an embodiment, an implementation of a 6 transistor SRAM cell poses a challenge since the cell contains two unpaired n-FET access transistors, thus a full 2:1 area efficiency cannot be achieved. Nevertheless a compact layout can be obtained as shown in FIG. 8C., using 4 FECFETs with a layout area of just 64 lithography squares. A solution for the access devices is to connect a terminal of the p-FET to $V_{DD}$, as shown in FIGS. 8A-B so it will not interfere with the operation of the N-FET access device.

OTHER EMBODIMENTS

Figure 9A:
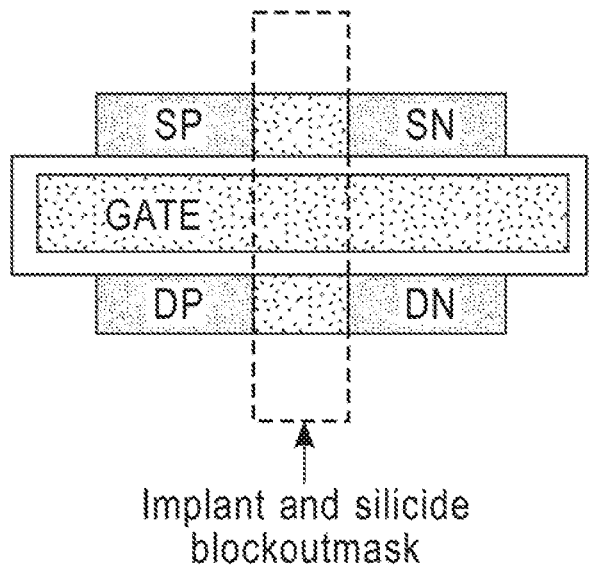
FIG. 9A shows a side-by side configuration for FECFETs, with a gate between P+ and N source regions using a silicide block out mask for separate drain contact, according to embodiments of the disclosure.
Figure 9B:
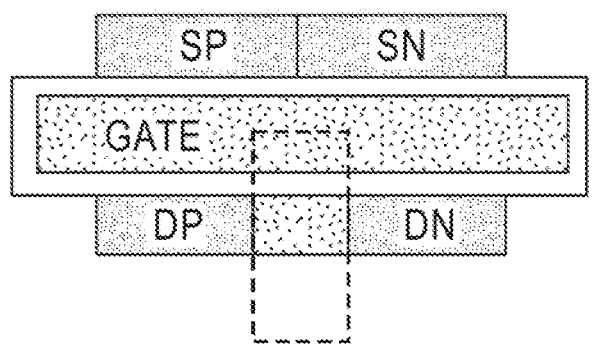
FIG. 9B shows a side-by side configuration for FECFETs, using a silicide block out mask for shared drain contacts, according to embodiments of the disclosure.

According to an embodiment, an issue with an FECFET as shown in FIG. 5B is that each FET has a 1:1 width to length (W/L) ratio, which would not be ideal for all circuits, especially high-speed circuits where a large W/L ratio is often needed. For small adjustments of the relative W/L ratio between n- and p-FETs, a rectangular rather than square gate stencil may be employed, however where large W/L is desired for both n- and p-FETs, a side-by side arrangement depicted in FIGS. 9A-B may be used. FIG. 9A shows a side-by side configuration for FECFETs, with gate GATE between P+ and N+ source regions SP and SN and P+ and between N+ drain regions DP and DN, using a silicide block out mask for separate drain contact, and FIG. 9B shows a side-by side configuration for FECFETs, using a silicide block out mask for shared drain contacts. A block-out mask is used to separate the N+ and P+ doped regions. Where desired, the N+ and P+ regions can be connected together, as shown in FIG. 9B for source regions SP and SN. The gate capacitance in this arrangement will be doubled compared to the square layout but that could be a worth-while trade-off to achieve large W/L.

While embodiments of the present disclosure has been described in detail with reference to exemplary embodiments, those skilled in the art will appreciate that various modifications and substitutions can be made thereto without departing from the spirit and scope of the disclosure as set forth in the appended claims.

What is claimed is:

1. A field-effect transistor (FET), comprising:
   a semiconductor substrate having a first side, a second side opposite from the first side, a third side that connects the first side and the second side, and a fourth side opposite the third side that connects the first side and the second side; and a ferroelectric gate stack disposed on a central portion of an upper surface of the substrate, wherein the ferroelectric gate stack comprises
a gate insulating layer;
a ferroelectric material layer disposed on the gate insulating layer; and
a metal layer disposed on the ferroelectric material layer, wherein a portion of the upper surface of the substrate that extends from the first side to under the ferroelectric gate stack and a portion of the upper surface of the substrate that extends from the second side to under the ferroelectric gate stack is doped with n-type impurities forming n-type contacts along the first side and the second side, and a portion of the upper surface of the substrate that extends from the third side to under the ferroelectric gate stack and a portion of the upper surface of the substrate that extends from the fourth side to under the ferroelectric gate stack is doped with p-type impurities forming p-type contacts along the third side and the fourth side;

self-aligned silicided contacts formed in the n-types contacts and in the p-type contacts;

sidewall spacers form along sides of a stack of the gate insulating layer, the ferroelectric material layer, and the metal layer, and self-aligned silicided shorts between at least one n-type contact and at least one p-type contact, wherein a presence of both n and p channels in a same region increases a capacitance and voltage gain of the ferroelectric gate stack.

2. The FET of claim 1, wherein the ferroelectric gate stack has a 1:1 width to length (W/L) ratio.

3. An invertor, comprising:
a semiconductor substrate having a first side, a second side opposite from the first side, a third side that connects the first side and the second side, and a fourth side opposite the third side that connects the first side and the second side;

a ferroelectric gate stack disposed on a central portion of an upper surface of the substrate, wherein the ferroelectric gate stack comprises
a gate insulating layer,
a ferroelectric material layer disposed on the gate insulating layer; and
a metal layer disposed on the ferroelectric material layer, wherein a portion of the upper surface of the substrate that extends from the first side to under the ferroelectric gate stack and a portion of the upper surface of the substrate that extends from the second side to under the ferroelectric gate stack is doped with n-type impurities forming n-type contacts along the first side and the second side, and a portion of the upper surface of the substrate that extends from the third side to under the ferroelectric gate stack and a portion of the upper surface of the substrate that extends from the fourth side to under the ferroelectric gate stack is doped with p-type impurities forming p-type contacts along the third side and the fourth side; and a self-aligned silicided short between a first n-type contact along the first side and a first p-type contact along the third side, wherein
a second n-type contact along the second side is connected to ground,
a second p-type contact along the fourth side is connected to a supply voltage, and
the self-aligned silicided short is connected to an output terminal
wherein a presence of both n and p channels in a same region increases a capacitance and voltage gain of the ferroelectric gate stack.

* * * * *